(12) United States Patent
Benner et al.

(10) Patent No.: US 8,471,203 B2
(45) Date of Patent: Jun. 25, 2013

(54) PARTICLE-BEAM MICROSCOPE

(75) Inventors: Gerd Benner, Aalen (DE); Matthias Langer, Heubach-Lautern (DE)

(73) Assignee: Carl Zeiss Microscopy GmbH, Jena (DE)

( * ) Notice: Subject to any disclaimer, the term of this patent is extended or adjusted under 35 U.S.C. 154(b) by 454 days.

(21) Appl. No.: 12/756,455

(22) Filed: Apr. 8, 2010

(65) Prior Publication Data

US 2010/0258719 A1 Oct. 14, 2010

(30) Foreign Application Priority Data

Apr. 8, 2009 (DE) .......................... 10 2009 016 861

(51) Int. Cl.
*G01N 23/00* (2006.01)
(52) U.S. Cl.
USPC ......................................... 250/311; 250/306
(58) Field of Classification Search
USPC ...... 250/396 R, 310, 492.23, 306, 311; 850/9
See application file for complete search history.

(56) References Cited

U.S. PATENT DOCUMENTS

| | | | |
|---|---|---|---|
| 3,795,813 A | 3/1974 | Kunath | |
| 3,857,034 A | 12/1974 | Hoppe | |
| 3,889,114 A * | 6/1975 | Jan van Oostrum | .......... 250/306 |
| 3,996,468 A | 12/1976 | Fletcher et al. | |
| 5,319,207 A | 6/1994 | Rose et al. | |
| 5,811,805 A * | 9/1998 | Osakabe et al. | .............. 250/311 |
| 6,441,384 B1 * | 8/2002 | Kojima | ..................... 250/492.23 |
| 6,548,810 B2 * | 4/2003 | Zaluzec | ............................. 850/9 |
| 6,797,956 B2 | 9/2004 | Benner | |
| 7,663,102 B2 * | 2/2010 | Frosien | .......................... 250/310 |
| 2003/0132383 A1 | 7/2003 | Benner | |
| 2004/0036031 A1 | 2/2004 | Rose et al. | |
| 2004/0075053 A1 | 4/2004 | Preikszas et al. | |
| 2007/0085007 A1 | 4/2007 | Araki et al. | |
| 2007/0284536 A1 * | 12/2007 | Frosien | ..................... 250/396 R |

FOREIGN PATENT DOCUMENTS

| | | |
|---|---|---|
| DE | 20 43 749 A | 3/1972 |
| DE | 23 02 121 A | 8/1973 |
| DE | 2 213 208 A | 10/1973 |
| EP | 0 451 370 A1 | 10/1991 |
| EP | 0 530 640 A1 | 3/1993 |
| EP | 1 329 936 B1 | 11/2006 |
| JP | 2008-084643 | 4/2008 |
| WO | WO 02/067286 | 8/2002 |

OTHER PUBLICATIONS

R. Vincent et al.: "Double conical beam-rocking system for measurement of integrated electron diffraction intensities", Ultramicroscopy, vol. 53, 1994, p. 271-282.
German office action, with English translation, for corresponding DE Application No. 10 2009 016 861.3, dated Aug. 30, 2011.

* cited by examiner

*Primary Examiner* — Jack Berman
*Assistant Examiner* — Johnnie L Smith
(74) *Attorney, Agent, or Firm* — Fish & Richardson P.C.

(57) ABSTRACT

A particle beam microscope includes an illumination system generating a particle beam having a ring-shaped conical configuration. A selective detection system is configured to selectively detect one of two groups of particles having traversed the object region. The first group of particles includes the particles that traversed the object region un-scattered or scattered by a small scattering amount. The second group of particles includes particles scattered in the object region by a greater scattering amount.

35 Claims, 12 Drawing Sheets

PARTICLE-BEAM MICROSCOPE

CROSS-REFERENCES TO RELATED APPLICATIONS

The application claims priority under 35 U.S.C. §119 to German Patent Application No. 10 2009 016 861.3, filed Apr. 8, 2009, and entitled "PARTICLE BEAM MICROSCOPE", the entire contents of which are hereby incorporated by reference.

FIELD

The disclosure relates to particle beam microscopes in which a particle beam is directed onto a sample to be inspected and in which particles having traversed the sample are detected.

BACKGROUND

Conventional particle beam microscopes use electron beams, proton beams, ion beams, x-ray beams and others as the particle beams. In some particle beam microscopes, the particle beams are finely focused at a location in the sample. In such microscopes, the location at which the particle beam is focused can be displaced relative to a main particle beam direction in an axial direction as well as a lateral direction to be able to scan the beam focus across the sample. Detection signals of particles having interacted with the sample may be recorded in dependence of the location at which the beam is focused in order to obtain a two-dimensional image or a three-dimensional volume image of the sample. In such situations, an extension of the particle beam focus determines a spatial resolution of the microscope. In view of a high lateral resolution, the focus region should have a small lateral extension, and in view of a higher longitudinal resolution, the focus region should have a small longitudinal extension.

The particles of the focused particle beam are incident on the sample from different directions. Generally, the different directions are from within a cone having apex angles $+\alpha$ and $-\alpha$ relative to a main beam direction such that the total apex angle is $2\alpha$. The longitudinal resolution is related to a depth of focus of optics used for focusing the particle beam, wherein the depth of focus is proportional to $1/\alpha^2$. In view of a high longitudinal resolution, the apex angle of the cone should have a high value. However, particle optical lenses used for focusing the particle beam typically exhibit an opening error which is proportional to $\alpha^3$. High values of the apex angle result in a relatively low lateral resolution, accordingly.

An example of a particle beam microscope is a scanning transmission electron microscope as disclosed in U.S. Pat. No. 6,548,810 B2, the entire contents of which are hereby incorporated by reference.

SUMMARY

According to embodiments of the present disclosure, a particle beam microscope is provided in which particles of a particle beam which is directed onto a sample are incident onto the sample from selected directions.

According to embodiments, a particle beam microscope allows for a greater flexibility in selecting parameters of the particle beam for adjusting a lateral resolution and a longitudinal resolution.

According to embodiments, a particle beam microscope includes an illumination system configured to focus a particle beam at a location of a sample such that a region of a higher particle density in the beam has a relatively low extension in both a lateral direction relative to a main beam direction and a longitudinal direction parallel to the main beam direction.

According to embodiments, an illumination system of a particle beam microscope is configured to direct a particle beam towards a sample such that particles of the particle beam are incident at the sample from selected angular directions. According to embodiments, all particles of the beam incident at the sample have an angle of incidence greater than a predetermined first limit angle relative to a main beam direction. In particular, the directed particle beam may not contain any particles propagating along the main beam direction.

According to embodiments, the particles of the focused particle beam are incident at the sample from directions oriented relative to the main beam direction at an angle smaller than a predetermined second limit angle.

According to embodiments, the particles of the particle beam are incident at the sample from directions oriented relative to the main beam direction at angles greater than or equal to the first limit angle and smaller than or equal to the second limit angle. According to particular embodiments, the particle beam may have a ring-shaped conical configuration wherein an inner apex angle of the cone corresponds to the first limit angle and wherein an outer apex angle of the cone corresponds to the second limit angle.

According to embodiments, the particle beam microscope includes a detection system having at least one detector located downstream of an object region in which a sample can be located in a beam path of the microscope. The detector of the detection system can be used to detect particles directed to the object region and having traversed the object region. The particles having traversed the object region can be divided into two groups. A first group of particles includes only those particles which have traversed the object region substantially un-scattered. These particles traverse the object region along a straight line or they are scattered within a sample by a scattering angle which is smaller than a predetermined scattering limit angle. A second group of the two groups of particles includes such particles which are scattered within the sample by a substantial amount such that they are deflected from their original direction of incidence onto the sample. These particles are scattered in the object region by a substantial scattering angle which is greater than the predetermined scattering limit angle.

According to embodiments of the particle beam microscope, the detection system is configured such at least one detector is configured to detect particles of only one group of those two groups of particles. The detection system can then be configured such that the particles of the one group are incident on this detector while the particles of the other group are not incident on this detector.

According to exemplary embodiments, the detection system includes an aperture plate having an aperture disposed at a distance from an optical axis of the microscope. The aperture may be formed as a ring-shaped aperture which is configured such that only particles of the first group of particles can traverse the aperture while other particles may not traverse the aperture. A first detector can be arranged in the beam path of the microscope downstream of this aperture to detect particles of the first group having traversed the aperture. The first detector may detect those particles of the particle beam focused onto the sample which have not been scattered at the sample by a significant amount. A microscopic image of the sample generated from detection signals of the first detector can be referred to as a bright field image as used in conventional particle beam methods.

According to exemplary embodiments, the detection system includes an aperture plate having an aperture configured such that only particles of the second group can traverse the aperture while all other particles may not traverse the aperture. A second detector can be disposed in the beam path of the microscope downstream of this aperture plate to detect particles of the second group having traversed the aperture plate. The second detector will then detect those particles of the particle beam focused onto the sample which have been scattered in the sample by a significant amount. A microscopic image of the sample generated from detection signals of the second detector may be referred to as a dark field image as used in conventional particle beam methods.

According to exemplary embodiments, the aperture plate which can be traversed by the particles of the second group includes two apertures arranged at different distances from the optical axis of the microscope. According to embodiments herein, one of the two apertures is formed as a ring shaped aperture having an inner peripheral edge located at a distance from the optical axis, and a second aperture of the plate has an outer peripheral edge located at a smaller distance from the optical axis than the inner peripheral edge of the first aperture. The second aperture can be also formed as a ring shaped aperture having an inner peripheral edge, or it may be formed as a full circular aperture extending, in a radial direction, to the optical axis.

According to embodiments, the detection system has only the first detector as illustrated above while the second detector is not provided, such that only particles of the first group can be detected. According to alternative embodiments, the detection system includes only the second detector while the first detector is not present such that only particles of the second group can be detected.

According to embodiments, the detection system includes both the first detector and the second detector such that the first and second groups of particles can be independently detected.

According to exemplary embodiments, detectors for detection of the first group of particles and detectors for detection of the second group of particles are disposed at different distances from the object region. The detector located closer to the object region has a detection surface having a limited radial extension relative to the optical axis, such that those particles which are to be detected by the detector arranged at a greater distance from the object region may traverse the detector without being incident on its detection surface. The detector located closer to the object region may have an outer peripheral edge for detecting particles with a detection surface located radially within the outer peripheral edge. Alternatively, or in addition thereto, the detector may have an inner peripheral edge defining a central bore for detecting particles using a detection surface extending radially outside of the inner peripheral edge.

The particles of the second group of particles which are scattered in the object region by a substantial amount can be divided into two sub-groups. A first sub-group of the second group includes those particles of the particle beam which are scattered towards the optical axis of the microscope while the second sub-group of the second group of particles includes those particles which are scattered away from the optical axis. Separate detectors can be provided for selectively detecting the particles of the two sub-groups. According to embodiments, detectors for selectively detecting the two sub-groups can be located at different distances along the main beam direction from the object region, and aperture plates can be provided for selecting the particles of the two sub-groups, wherein the aperture plates may have suitable apertures having inner peripheral edges and/or outer peripheral edges having selected distances from the optical axis.

According to embodiments, a particle beam microscope includes an illumination system located in the particle beam path upstream of an object region and configured to direct charged particles onto the object region such that the particles are incident from directions having an angle relative to a main beam direction greater than a predetermined inner cone angle, and wherein the particle beam microscope includes an aperture plate having a ring-shaped aperture located downstream of the object region.

According to embodiments herein, the ring-shaped aperture of the aperture plate is configured such that a first group of particles traversing the object region along a straight line or scattered in the object region by a scattering angle which is smaller than a scattering limit angle may traverse the ring aperture while a second group of particles which are scattered in the object region by a scattering angle greater than the scattering limit angle are incident on the plate of the aperture plate.

According to embodiments, the particle beam microscope includes a particle-optical lens having an object plane in which the object region is located, wherein the aperture plate having the ring-shaped aperture is disposed in an image-side focal plane of the particle-optical lens or in a plane conjugate thereto.

According to embodiments, a location at which the particle beam is focused within a sample can be displaced relative to the sample. According to exemplary embodiments herein, the particle beam microscope includes a sample mount having an actuator to displace the sample relative to an illumination system of the particle beam microscope. The actuator can be configured to displace the sample in a direction transverse to an optical axis of the microscope and/or in a direction along the optical axis, and the actuator can also be configured to change an orientation of the sample relative to the optical axis.

According to other embodiments, the illumination system of the particle beam microscope includes particle beam manipulators to achieve a lateral or longitudinal displacement of the beam focus relative to the sample or an orientation of the main beam direction relative to the sample without making it desirable to displace the sample relative to the illumination system.

According to embodiments, such beam manipulators include deflectors. According to exemplary embodiments, the illumination system includes at least one deflector which is configured to displace a location at which the particle beam is focused in a lateral direction relative to the optical axis. Two such deflectors can be provided for displacing the location at which the particle beam is focused in two independent directions such that an xy-scan of the beam focus can be performed, for example. Such deflector can be located in a focal plane of the particle-optical lens for focusing of the particle beam in the object plane.

According to further exemplary embodiments, the deflector is configured to change a main beam direction of the particle beam focused in the object region relative to an optical axis of the illumination system. This results in a tilt of the main direction of incidence of the particle beam relative to the optical axis. A deflector for achieving such deflection can be located in a plane conjugate to the object plane of a particle-optical lens for focusing of the particle beam in the object plane.

According to further embodiments, a beam manipulator for displacing the focus region of the particle beam in a longitudinal direction relative to the optical axis includes a particle-optical lens of the illumination system. For example, it is possible to displace the location at which the particles are focused along the optical axis by changing an optical power of the focusing lens.

BRIEF DESCRIPTION OF THE DRAWINGS

The forgoing as well as other advantageous features of the disclosure will be more apparent from the following detailed description of exemplary embodiments of the disclosure with reference to the accompanying drawings. It is noted that not all possible embodiments of the present disclosure need not exhibit each and every, or any, of the advantages identified herein.

DETAILED DESCRIPTION OF EXEMPLARY EMBODIMENTS

Figure 1:
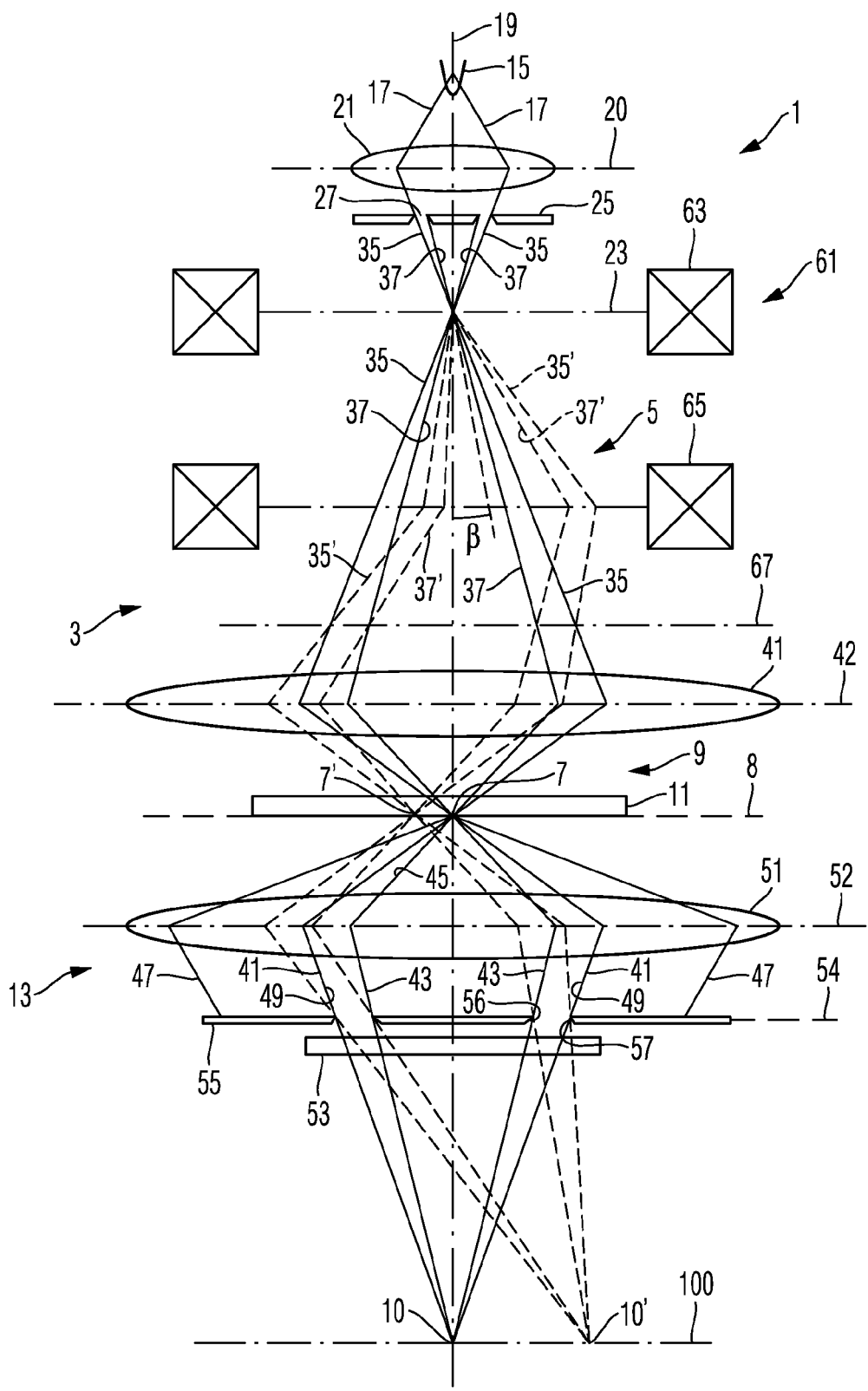
FIG. 1 is a schematic illustration of a particle beam microscope according to a first embodiment.

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

FIG. 1 is a schematic illustration of beam paths and components of a particle beam microscope. The particle beam microscope 1 includes an illumination system for focusing a particle beam 5 at a location 7 of a sample 11 arranged in an object region 9. At least some of the particles of the particle beam 5 traverse the sample 11 and can be detected by a detection system 13.

The illumination system 3 includes a particle beam source 15 configured to provide particles for generating the particle beam 5 focused at the location 7. In the illustrated embodiment, the particle source 15 is an electron source. The particle source 15 emits particles into an angular range such that a shape of the beam is defined by an outer cone surface indicated by reference numeral 17 in FIG. 1. The particle beam source and other components of the particle beam microscope 1 are symmetrically disposed relative to an optical axis 19 of the microscope 1 such that a main beam direction of the particle beam 5 as emitted by the particle source 15 is oriented along the optical axis 19.

A particle optical lens 21 having a principal plane 20 is configured to focus the particle beam emitted from the source 15 in a plane 23. In the illustrated embodiment in which the particles of the particle beam are electrons, the lens 21 as well as all other lenses of the microscope, are electron lenses which may include electrostatic lenses, magnetic lenses and combinations of electrostatic and magnetic lenses.

An aperture plate 25 is disposed in the beam path between the lens 21 and the plane 23. The aperture plate is illustrated with reference to FIG. 2 below.

The aperture plate 25 includes a plate 26 having a ring shaped aperture 27 which can be traversed by particles. The ring aperture 27 is defined by an inner peripheral edge 29 extending about the optical axis 19 at a distance r1. The ring aperture 29 has an outer peripheral edge 30 extending about the optical axis 19 at a distance r2 which is greater than distance r1. Particles incident on the aperture plate with a distance less than r1 from the optical axis 19 or with a distance greater than r2 from the optical axis 19 will be absorbed by the plate 26. Only those particles which are incident on the aperture plate at a distance from the optical axis greater than r1 and less than r2 may traverse the aperture plate through the aperture 27.

Due to practical reasons, the ring-shaped aperture 27 is not an ideal ring aperture extending uninterrupted around the optical axis 19. The inner portion of the plate 26 defining the inner peripheral edge 29 has to be mounted together with the outer portion of the plate 26 defining the outer peripheral edge 13. For this purpose, plural links 31 are provided which connect both portions of the plate 26 with each other.

Reference is made to FIG. 1 again. The particle beam incident on the aperture plate 25 is transformed by the aperture plate 25 into a particle beam having a ring shaped cross section. The cross section of the beam is defined by an outer envelope surface 35 having a conical shape. The beam is further defined by an inner envelope surface 37 also having a conical shape. The particles of the beam propagate along trajectories having an angle relative to the optical axis 19 which is greater than an inner apex angle of envelope surface 37 and smaller than an outer apex angle of envelope surface 35.

A cross section of the beam is reducing towards the plane 23 and is continuously extending downstream of the plane 23 until the beam enters a particle-optical lens 41 having a principal plane 42. The lens 41 is configured to focus the beam at the location 7. The lens 42 also images the plane 23 into a plane 8 in which the location 7 at which the beam is focused is located. The beam has the ring shaped cross section also immediately upstream of the plane 8. This has the consequence that all particles incident at location 7 originate from directions oriented relative to the optical axis 19 under angles greater than the inner apex angle of the beam and smaller than the outer apex angle of the beam upstream of the plane 8. In particular, no particles will be incident at location 7 which propagate along trajectories parallel to the optical axis 19 or which are oriented under an angle relative to the optical axis 19 smaller than the inner apex angle of the beam immediately upstream of the location 7.

A focus region in which a particle beam density of the particle beam is high within the sample 11 should be chosen as small as possible in order to achieve a high resolution. A size of a focus region can be conventionally described in terms of the radius of the disk of least confusion. For the particle beam of ring conical shape it can be shown that this radius of the disk of least confusion is represented by $$\delta_S^H = \alpha^2 \cdot \Delta\alpha,$$

wherein $\alpha$ is the outer apex angle of the beam immediately upstream of the focus location 7 and $\Delta\alpha$ represents a difference between the outer apex angle and the inner apex angle.

In a situation of the conventional particle beam microscope in which the beam cross section has a shape of a full cone and in which particles propagate along the optical axis and under small angles relative to the optical axis, the radius of the of the disk of least confusion would be represented by $$\delta_S^H = 1/4\alpha^3,$$

wherein $\alpha$ again represents the outer apex angle of the beam.

It is apparent that using the particle beam having the ring conical shape reduces the opening error as compared to the particle beam having the shape of a full cone. For exemplary values for a of 100 mrad and $\Delta\alpha$ of 1 mrad, an improvement of the resolution by a factor of 25 can be achieved as compared to a beam having the shape of the full cone and an outer cone angle of 100 mrad.

The particles of the beam incident on the sample 11 may interact with the sample while traversing the same. Herein, the particles may traverse the sample 11 along straight lines if the interaction with the sample is small, or they may be scattered by a small scattering angle if the interaction with the sample is small. On the other hand, the particles may be scattered at a significant scattering angle if the interaction with the sample is significant.

The particles having traversed the sample 11 may be divided into two groups, accordingly. A first of the two groups includes those particles having traversed the sample along a straight line or having been scattered by a scattering angle smaller than a scattering limit angle. A second group of the two groups includes those particles which have been scattered while traversing the sample by a scattering angle greater than the scattering limit angle.

The second group of particle can be further divided into two sub-groups. The first sub-group of the two sub-groups includes those particles which have experienced a significant amount of scattering towards the optical axis while traversing the sample, and the second sub-group of the two sub-groups includes those particles which have experienced a significant amount of scattering away from the optical axis 19 while traversing the sample.

A beam formed of particles of the first group is represented in FIG. 1 by envelope lines 41 and 43 of its beam bundle having a ring conical shape. A beam formed of particles of the first sub-group of the second group is represented in FIG. 1 by a envelope line 54 of its conical shape, and a beam formed of particles of the second sub-group of the second group is represented in FIG. 1 by outer and inner envelope lines 47 and 49, respectively, of its ring conical shape.

The divergent beam having traversed the object region 9 enters a lens 51 having a principal plane 52. The lens 51 is configured to focus the beam such that its ring shaped cross section is continuously reducing with increasing distance from the lens 51 downstream thereof.

The detection system 13 includes a particle detector 53 which is configured to detect incident particles by triggering a corresponding signal, such as an electrical signal or an optical signal, which can be processed upon incidence of a particle. If the particle beam is an electron beam, the detector 53 will be an electron detector.

The detection system 13 is configured such that only particles of the first group are incident on the detector 53 such that the detection system is configured to selectively detect only particles of the first group. For this purpose, an aperture plate 55 is provided in a focal plane 54 of the lens 51 or in a plane conjugate to the focal plane of the lens 51. The aperture plate 55 has a ring shaped aperture defined by a radial inner edge 56 and a radial outer edge 57. The aperture plate 55 may have a configuration similar to that illustrated with reference to FIG. 2 for aperture plate 25 above. The inner edge 56 and the outer edge 57 of the ring shaped aperture of the aperture plate 55 have dimensions and are positioned such that only the particles of the first group may traverse the ring shaped aperture to be incident on the detector 53. The particle of the first sub-group of the second group having traversed the sample 11 are incident on the aperture plate 54 at a distance from the optical axis 19 which is smaller than the radius of the inner peripheral edge 56 of the ring shaped aperture such that they get absorbed by the aperture plate. Similarly, the particles of the second sub-group of the second group having traversed the samples are incident on the aperture plate 55 at a distance from the optical axis 19 which is greater than the radius of the outer peripheral edge 57 of the ring shaped aperture, such that also those particles get absorbed by the aperture plate 55.

As illustrated above, the detection system 13 is configured to selectively detect only one group of particles of the particle beam incident on the sample and having the ring conical configuration, wherein it is the first group of particles which is detected by the detector 53 of the embodiment shown in FIG. 1. The detection system is thus configured to detect only those particles which are not scattered at the sample or which are scattered at the sample by a small scattering angle. A microscopic image of the sample generated from detection signals of detector 53 can be referred to as a bright-field image, accordingly.

To record such image, it is advantageous to displace the location 7 at which the beam is focused in the object region 9 relative to the object region and to record a multitude of detection signals associated with the different displacements. For this purpose, the illumination system 3 includes a deflection system 61 having two deflectors 63 and 65 arranged at a distance from each other along the optical axis 19. In the illustrated embodiment, in which particles of the particle beam are electrons, the deflectors 63 and 65, as well as all other deflectors of the microscope 1, may include electrostatic deflectors or magnetic deflectors or combinations of electrostatic deflectors and magnetic deflectors.

In the illustrated example, the deflector 63 is arranged in the plane 23 to deflect the beam 5, wherein the plane 23 is that plane which is imaged by the lens 41 into the object plane 8. According to other embodiments, the deflector can be arranged in planes different from plane 23. One exemplary representation of a deflected beam is indicated in FIG. 1 by broken lines designated by the same reference numerals as the non-deflected beam shown in full lines, wherein the reference numerals of the deflected beam are supplemented by an apostrophe. By energizing the deflector 63 it is thus possible to deflect the beam such that its main beam direction is oriented under an angle $\alpha$ relative to the optical axis 19. The deflected beam maintains its ring shaped cross section which is not changed by the deflector 63. The deflected beam is defined by an outer conical envelope surface 35' and an inner conical envelope surface 37', accordingly.

The deflector 65 deflects the beam into a direction opposite to a deflection direction of the deflector 63 such that the deflected beam traverses a front focal plane 67 of the lens 41 at a same ring shaped cross section as the non-deflected beam. This results in that the deflected beam 35', 37' is focused in the object plane 8 at a location 7' which is arranged at a distance of the location 7 at which the non-deflected beam is focused. By operating the deflectors 63 and 65 it is thus possible to displace the location 7 at which the beam is focused in the sample in a lateral direction relative to the optical axis. The displacement of the location 7 by operating the deflectors 63 and 65 can be performed such that the object region is systematically scanned, wherein, for example, an x-direction in the plane 8 is a main scan direction and wherein an y-direction orthogonal to the x-direction is the sub-scan direction.

It is further possible to vary a power of the particle optical lens 41 in order to displace the location 7 at which the particle beam is focused in the object region 9 in a direction parallel to the optical axis 19. By operating the deflection system 61 and by varying the power of the lens 41 it is thus possible to systematically scan a volume of the object region 9, wherein, for example, a direction along the optical axis 9 represents a z-direction or sub-sub-scan direction of the scanning process. Detection signals generated by detector 53 can be transformed into image signals representing volume elements or voxels of the recorded particle optical image of the scanned region of the sample 11.

Figure 2:
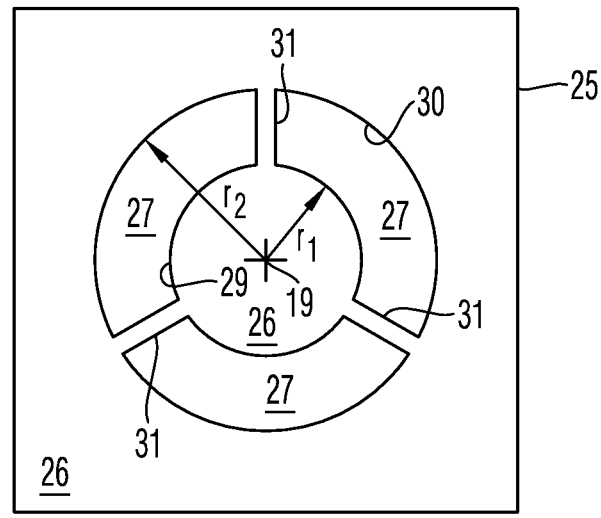
FIG. 2 is a schematic illustration of an aperture plate of the particle beam microscope shown in FIG. 1.
Figure 4:
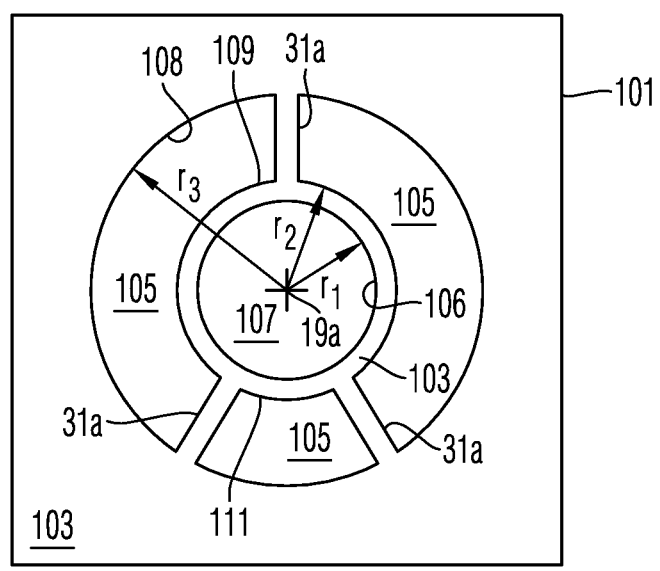
FIG. 4 is a schematic illustration of an aperture plate used in the particle beam microscope of FIG. 3.
Figure 3:
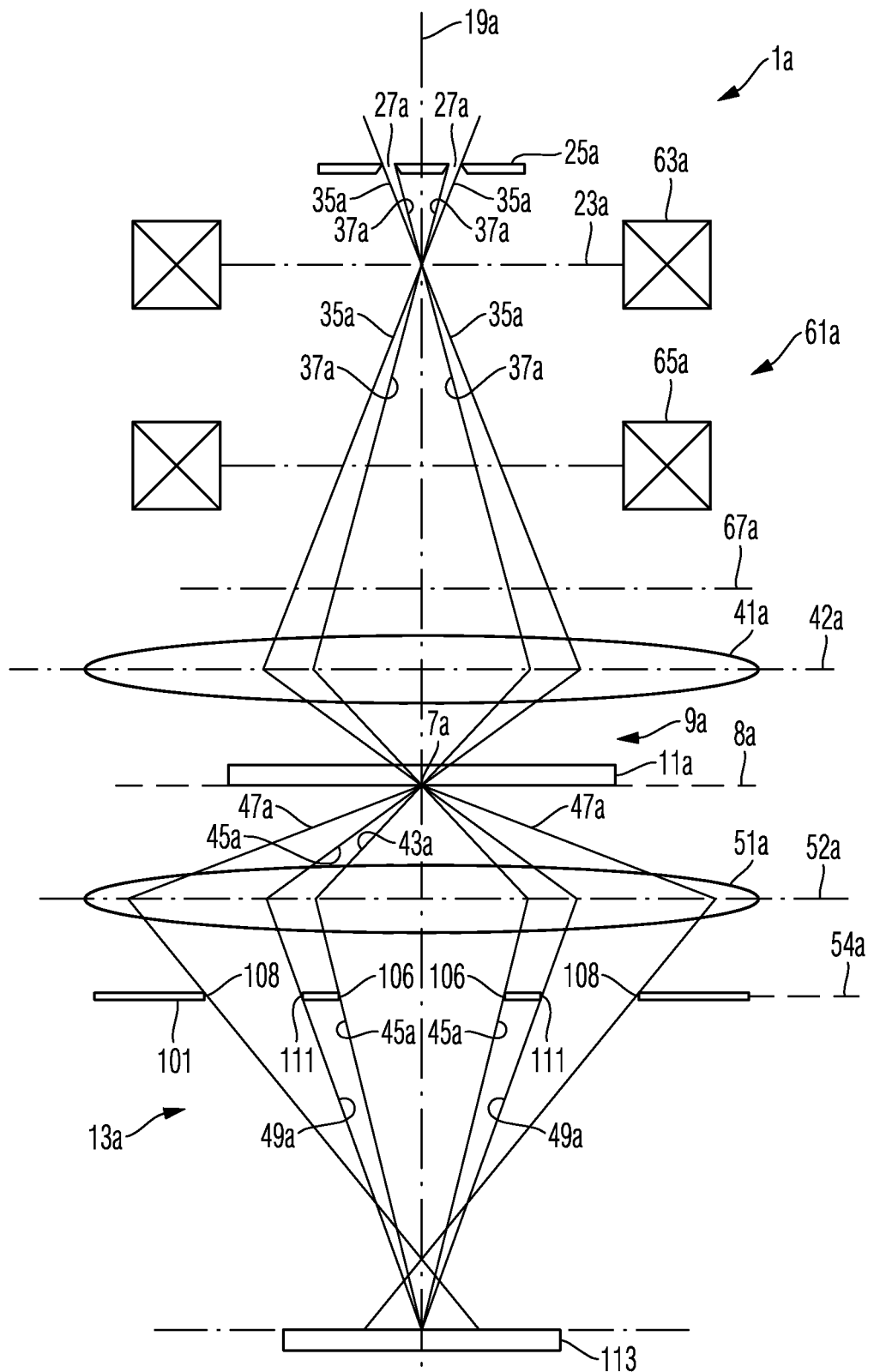
FIG. 3 is a schematic illustration of a particle beam microscope according to a second embodiment.

FIG. 3 is a schematic representation of components and beam paths of a particle beam microscope having a similar configuration as the particle beam microscope illustrated with reference to FIGS. 1 and 2 above. A main difference of the particle beam microscope 1a relative to the microscope shown in FIGS. 1 and 2 is that a detection system 13a includes an aperture plate 101 which has a function different from aperture plate 55 of the particle beam microscope shown in FIG. 1. A schematic elevational view of aperture plate 101 is shown in FIG. 4. The aperture plate 101 includes a plate 103 having two apertures 105 and 107 arranged at a radial distance from each other relative to an optical axis 19a of the particle beam microscope 1a. The radial inner aperture 107 is a circular aperture defined by an outer peripheral edge 106 located at a distance r1 from the optical axis 19a. The aperture 105 is a ring shaped aperture defined by an inner peripheral edge 109 located at a distance r2 from the optical axis 19a which is greater than distance r1, and an outer peripheral edge 107 located at a distance r3 from the optical axis 19a which is greater than r2. The plate 103 provides a ring 111 extending between the outer peripheral edge 106 of aperture 107 and inner peripheral edge 109 of aperture 105 wherein the ring 111 is carried by links 31a provided by the plate 103.

The aperture plate 101 is disposed in the beam path of the microscope 1a downstream of the object region 9a in a focal plane 54a of the lens 51a and has the apertures 105 and 107 dimensioned such that particles of the first group having traversed the object region 9a substantially un-scattered are incident on the ring 111 to be absorbed by the plate 103. Only particles of the second group experiencing a scattering process in the object region 9a and scattered by a scattering angle greater than the scattering limit angle may traverse the aperture plate 101 through one of apertures 105 and 107. The particles of the first sub-group of the second group, which are scattered towards the optical axis 19a traverse the aperture plate 101 through aperture 107, while the particles of the second sub-group of the second group, which are scattered away from the optical axis, traverse the aperture plate 101 through aperture 105. A detector 113 for detecting the particles of the second group having traversed the aperture plate 101 is disposed in the beam path downstream of the aperture plate 101. A particle optical image generated from detection signals of the detector 113 may be referred to as a dark field image since it is generated from detection events caused by particles having experienced significant scattering in the sample 11a.

Figure 5:
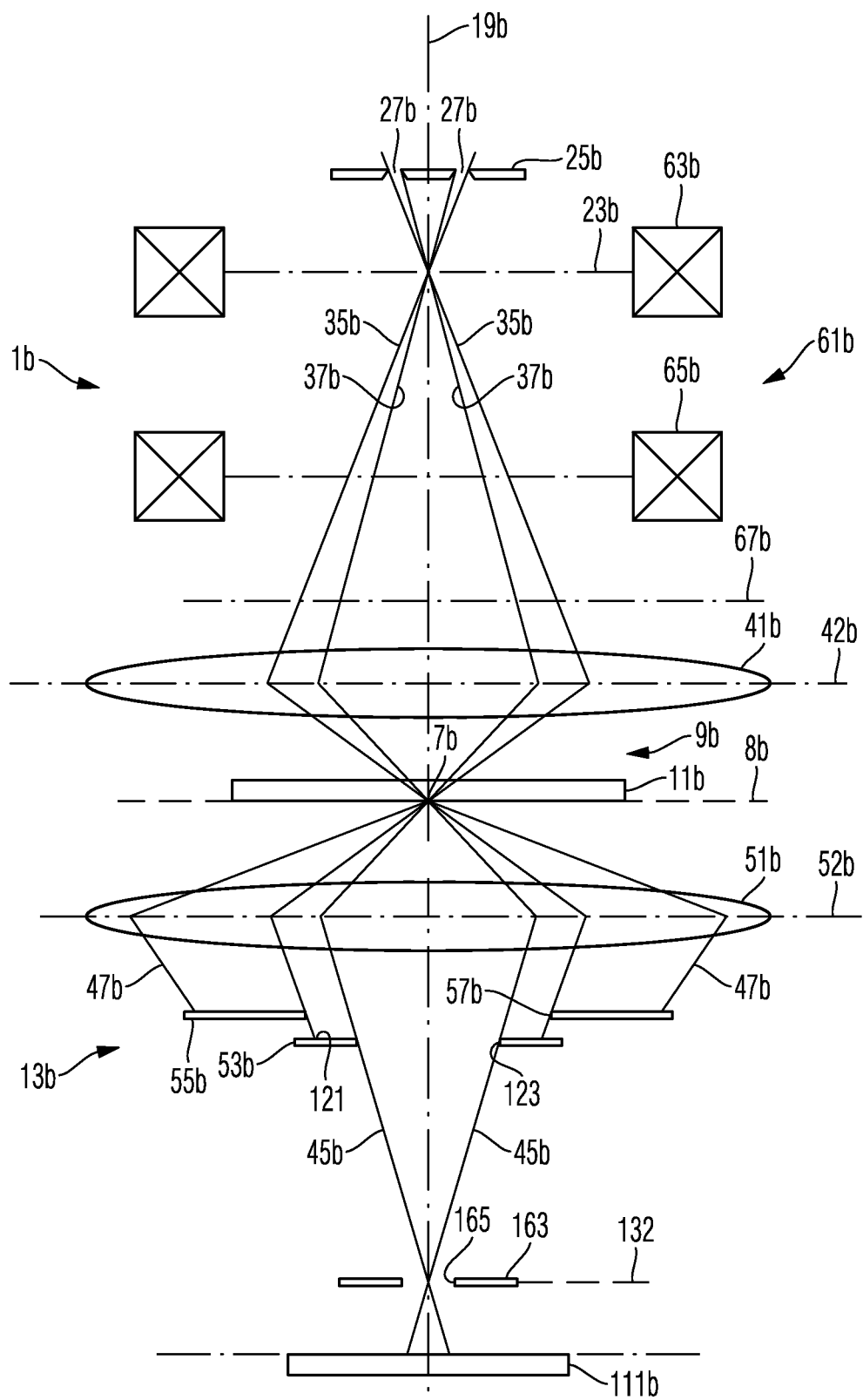
FIG. 5 is a schematic illustration of a particle beam microscope according to a third embodiment.

A further embodiment of a particle beam microscope 1b is shown in FIG. 5. The particle beam microscope 1b has a configuration similar to that of the particle beam microscopes illustrated with reference to FIGS. 1 to 4, wherein it mainly differs with respect to a configuration and function of its detection system 13b. The detection system 13b includes a detector 53b disposed in a beam path downstream of an object region 9b and configured to detect particles of the first group. The detection system 13b further includes a second detector 111b which is located in the beam path downstream of the detector 53b and configured to detect particles of the second group. The detection system 13b further includes an aperture plate 163 located in a plane 132 into which an image plane 8b is imaged by a lens 51b. The aperture plate 163 has a central aperture 165 dimensioned such that particles of the second sub-group of the second group are absorbed by the aperture plate 163 while particles of the first sub-group of the second group may traverse the aperture 165. The detector 111b will thus detect the particles of the first sub group of the second group.

Figure 6:
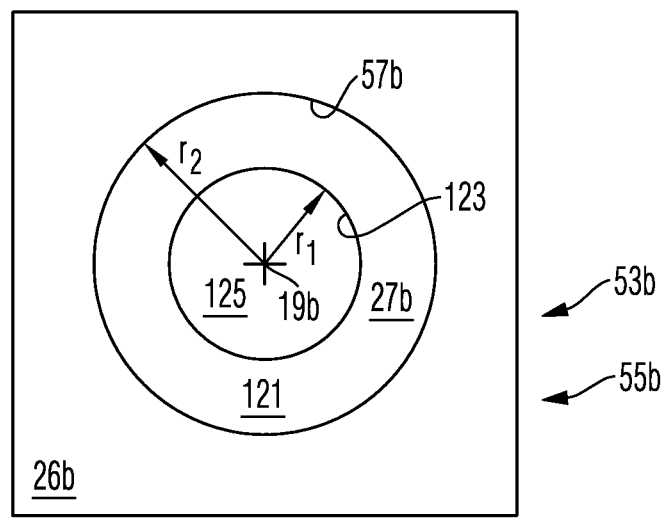
FIG. 6 is a schematic illustration of an aperture plate used in the particle beam microscope of FIG. 5.

An elevational view of an aperture 55b and the detector 53b is shown in FIG. 6. The detector 53b has a ring shaped detection surface 121 defined in the radial direction by an outer peripheral edge 123 of a central aperture 125 located at a distance r1 from an optical axis 19b. The particles of the first sub-group of the second group may traverse the detector 53 through its aperture 125 to be incident on the detector 111b.

The aperture plate 55b which is disposed in the beam path upstream of the detector 53b includes a plate 26b having a central aperture defined by an outer peripheral edge 57b located at a distance r2 from the optical axis 19b. Particles of the second sub-group of the second group are all incident on the plate 26b and are absorbed by the plate 26b, while particles of the first group may traverse the aperture plate 55b through its aperture 57b to be incident on the detection surface 121 of the detector 53b such that they can be detected by the detector 53b.

The particle beam microscope 1b is thus configured to generate a bright-field image from detection signals of the detector 53b and to generate a dark field image from detection signals of the detector 111b.

Figure 7:
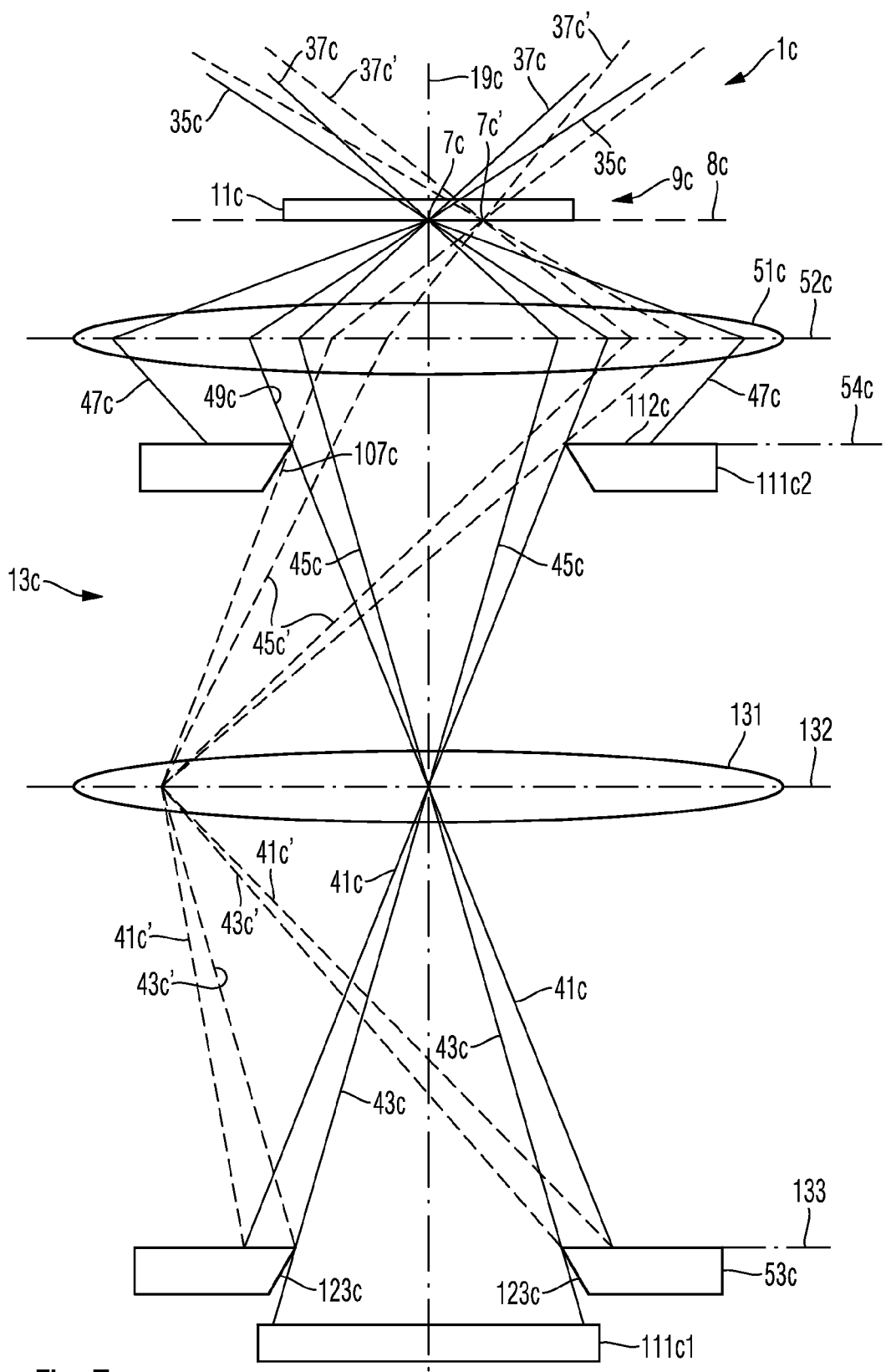
FIG. 7 is a schematic illustration of a particle beam microscope according to a fourth embodiment.

FIG. 7 illustrates a further embodiment of a particle beam microscope 1c having similarities to those particle microscopes illustrated with reference to FIGS. 1 to 6 above wherein it differs from those microscopes with respect to a configuration and function of a detection system 13c.

The detection system 13c includes a detector 53c configured to detect particles of the first group, a detector $111c_1$ configured to detect particles of the first sub-group of the second group, and a detector $111c_2$ configured to detect particles of the second sub-group of the second group.

A particle optical lens 51c having a principal plane 52c is located in a beam path downstream of an object region 9c such that an object plane 8c of the lens 51c is located in the object region 9c. The detector $111c_2$ is located in the beam path downstream of the lens 51c such that a detection surface 112c of the detector $111c_2$ is located in a back focal plane 54c of the lens 51c. The detector $111c_2$ includes a central aperture such that the detection surface 112c is defined by an outer peripheral edge 107c of the central aperture. The outer peripheral edge 107c of the aperture is dimensioned such that only particles of the second sub-group of the second group are incident on the detection surface 112c to be detected by the detector $111c_2$. The detector $111c_2$ will detect those particles scattered away from the optical axis while traversing a sample 11c. The other particles traverse the aperture of the detector 111C$_2$ and a second particle optical lens 131. The lens 131 has a principal plane 132 which is arranged such that the object plane 8c is imaged into the principal plane 132 of particle optical lens 131. The lens 131 images the back focal plane 54c of lens 51c into a plane 133, wherein a detection surface of detector 53c is also located in the image plane 133. The detector 53c has a central aperture, and the detection surface of the detector 53c is defined by an outer peripheral edge 123c of that aperture which is dimensioned such that particles of the first group are incident on the detection surface of the detector 53c. The particles of the second sub group of the second group traverse the detector 53c through its aperture and are incident on detector 111c$_1$ for detection.

Broken lines in FIG. 7 represent a beam path of a beam having a ring conical shape and which is focused at a location 7c' in the object plane 8c which is located at a distance from the optical axis 9c. The displacement of the focused location 7c away from the optical axis 19c can be achieved by a deflection system disposed upstream of the plane 8c and not shown in FIG. 7. The beam path shown in broken lines in FIG. 7 illustrates the function of particle optical lens 131. Due to the function of this lens it is possible to detect the particles of the first group which traverse the sample as the substantially un-scattered irrespective of the location 7c at which the incident beam is focused. Similarly, the detector 111c$_1$ will detect the particles of the first sub-group of the second group irrespective of the location 7c' at which the incident beam is focused in the object plane 8c.

According to a variation of the particle beam microscope shown in FIG. 7 it is possible to arrange the detectors 53c and 111c$_1$ in a same plane rather than in different planes. The same plane in which the detectors 53c and 111c$_1$ will then be arranged can be the plane 133 of FIG. 7 into which the back focal plane 54c of the lens 51c is imaged by lens 131. Such configuration of detectors 53c and 111c$_1$ can be achieved by a segmented detector having segmented ring portions wherein a central portion of the detector provides the detector 111c$_1$ and wherein an outer ring portion of the detector provides the detector 53c. Similarly, it is possible to provide a detector having a two-dimensional array of detection elements or pixels in the plane 133 and wherein detection signals of a central group of pixels are combined to provide detection signals corresponding to those of detector 111c$_1$, and wherein detection signals of an outer ring shaped group of pixels are combined to provide detection signals corresponding to those of detector 53c.

Figure 8:
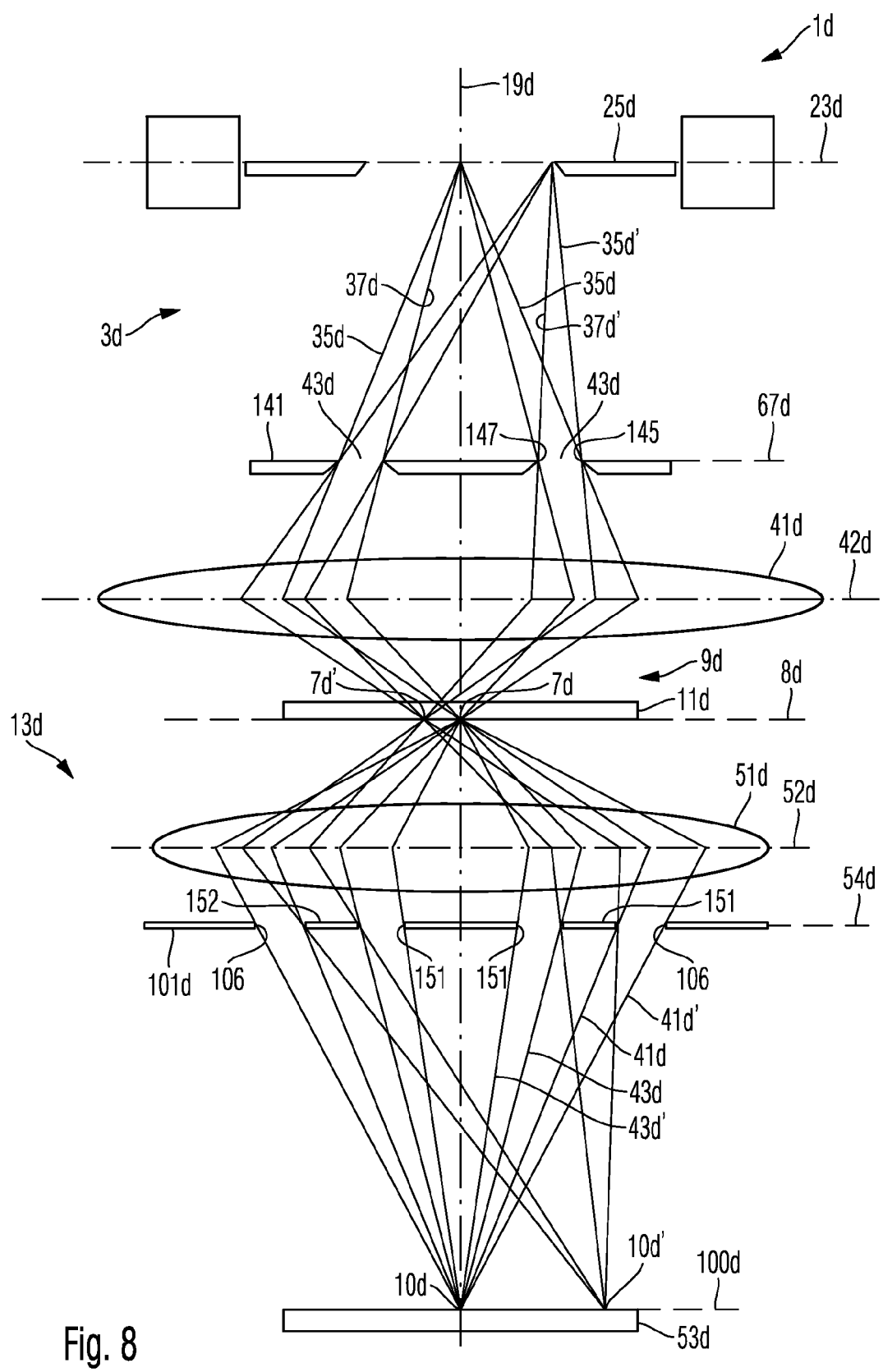
FIG. 8 is a schematic illustration of a particle beam microscope according to a fifth embodiment.

FIG. 8 is a schematic illustration of a portion of a further particle beam microscope 1d. The particle beam microscope 1d is a transmission electron microscope in which an illumination system 3d illuminates an extended field of an object plane 8d in which a sample 11d can be located. The illuminated field in the plane 8d is defined by an aperture plate 25d disposed in a plane 23d which is imaged into the object plane 8d by a particle optical lens 41d. An aperture plate 141 is located in a front focal plane 67d of the lens 41d. The aperture plate 141 has a ring shaped aperture 43d defined by an inner peripheral edge 147 and an outer peripheral edge 145. The ring shaped aperture 43d has an effect that both of exemplary locations 7d and 7d' shown in FIG. 8 are illuminated by particle beams having a ring conical configuration generated by the aperture plate 141 wherein the beams incident on location 7d and on location 7d' have the same inner apex angles and the same outer apex angles, wherein the inner apex angles are defined by the inner peripheral edge 147 and the outer apex angles are defined by the outer peripheral edge 145.

A detection system 13d located in the beam path downstream of the object plane 8d includes a particle optical lens 51d having a principal plane 52d for imaging the object plane 8d into an image plane 100d. A detector 53d is located in the image plane 100d. The locations 7d and 7d' which are spaced apart in the object plane 8d are imaged into locations 10d and 10d', respectively, in the image plane 100d such that a spatially resolved image of the sample 11d can be detected with position sensitive detector 53d.

Figure 9:
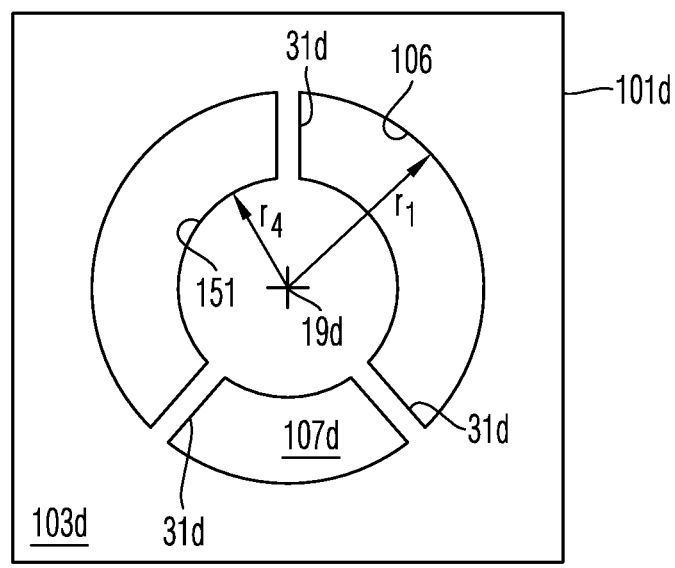
FIG. 9 is a schematic illustration of an aperture plate used in the particle beam microscope of FIG. 8.

An aperture plate 101d is located in a back focal plane 54d of the lens 51d. An elevational view of the aperture plate 101d is shown in FIG. 9. An outer peripheral edge 106 of a ring shaped aperture 107d is dimensioned such that particles traversing the sample 11d substantially un-scattered may traverse the aperture 107d. Trajectories of those particles extend radially inside of a line 41d shown in FIG. 8 and radially outside of a line 43d shown in FIG. 8. The outer peripheral edge 106 and the inner peripheral edge 151 of the aperture plate 101d are further configured such that, apart from the un-scattered particles 41d, 43d, also particles experiencing scattering by a significant scattering angle in the sample 11d may traverse the aperture 107. Trajectories of those particles extend radially inside of an outer cone surface represented by line 41d' in FIG. 8 and defined by the outer peripheral edge 106 of the aperture 107d, and they are located radially outside of an inner cone surface represented by a line 43d' in FIG. 8 and which is defined by the inner peripheral edge 151 of the ring shaped aperture 107d.

Detection signals of detector 53d are indicative of particles having traversed the sample 11d substantially un-scattered or particles having traversed the sample 11d scattered by an amount less than the scattering limit angle. An image generated for such detection signals has a relatively high contrast. This contrast can be further improved by providing a phase changing element 152 within the ring shaped aperture 107d, wherein the phase changing element 152 generates a phase shift of the particles having traversed the sample 11d substantially un-scattered relative to the particles scattered by an angle within the sample 11d. Embodiments of phase changing elements suitable for providing the phase changing element 151 are disclosed, for example, in US 2003/0132383 A1, the entire contents of which are hereby incorporated by reference.

Figure 10:
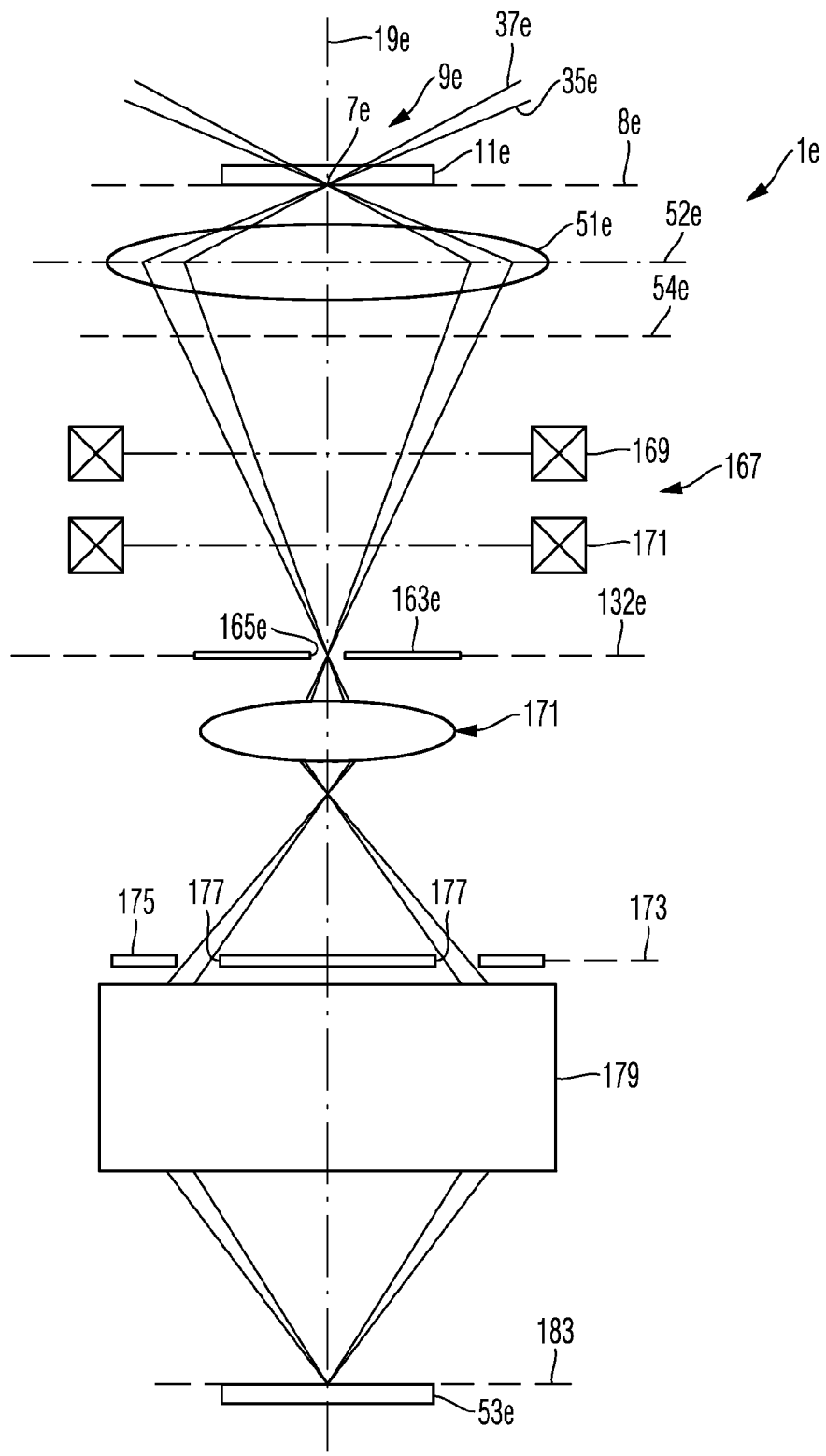
FIG. 10 is a schematic illustration of a particle beam microscope according to a sixth embodiment.

A portion of a further particle beam microscope 1e is schematically illustrated in FIG. 10. The particle beam microscope 1e has a configuration similar to those microscopes illustrated with respect to FIGS. 1 to 9 above. Also the particle beam microscope 1e includes an illumination system (not shown in FIG. 10) configured to focus a particle beam having a ring shaped cross section at a location 7e of a sample 11e. The particles scattered in the sample 11e or traversing the sample 11e substantially un-scattered are focused by a particle optical lens 51e in a plane 132e. An aperture 163e having a small aperture is located in the plane 132e. The aperture plate 163e will absorb those particles which are scattered in the sample outside of the focused region 7e. Thus, the aperture plate 163e allows only those particles to traverse the aperture 165e which originate from the focus region 7e. The particle traversing the aperture plate 163e can be detected subsequently.

A de-scan system 167 is arranged in the beam path between the lens 51e and the plane 132e. The de-scan system 167 includes two deflectors 169 and 171 arranged at a distance from each other along the beam path and which are energized in synchronism with a scan system (not shown in FIG. 10) of the illumination system used for displacing the focus location 7e in the plane 8e. The scan system may have a configuration as illustrated with respect to FIG. 1 above. The de-scan system 167 is used to compensate for the scanning of the focused location 7e across the plane 8e such that the focused location 7e is imaged into the aperture 165e of the aperture plate 63e irrespective of a scanning position of the focus location 7e achieved by the scan system.

A projection system 171 including one or more particle-optical lenses is provided in the beam path of the microscope 1e downstream of the aperture plate 163e. The projection system 171 images the back focal plane 54e of lens 51e into an entrance plane 173 of an energy loss spectrometer 179. An aperture plate 175 having a ring shaped aperture 177 is positioned in plane 173. The ring shaped aperture 177 is positioned and dimensioned such that it can be traversed by particles which have traversed the sample 11e substantially un-scattered or which have been scattered at the sample 11e by a scattering angle smaller than a scattering limit angle. These particles can be detected downstream of the aperture plate 175 to contribute to an image signal which can again be referred to as a bright-field image signal.

According to an exemplary variation of the particle beam microscope 1e shown in FIG. 10, it is possible to configure the aperture plate 175 to perform a function of a particle detector having a ring shaped aperture 177. The particles having traversed the sample 11e substantially un-scattered or having been scattered in the sample 11e by a scattering angle smaller than the scattering limit angle will traverse the ring shaped aperture 177 of the detector to be detected with detector 53e after traversal of the energy loss spectrometer 179. Those particles which have been scattered at the sample by a scattering angle greater than the scattering limit angle will be incident on the detection surface of the detector positioned in the plane 173 to contribute to an imaging signal which can be referred to as a dark-field signal.

According to a further variation of the particle beam microscope 1e shown in FIG. 10 it is possible to arrange a detector in the plane 54e, wherein this detector has a central aperture which can be traversed by particles having traversed the sample 11e substantially un-scattered or scattered towards the optical axis 19c such that this detector can detect particles scattered away from the optical axis 19e while traversing the sample 11e. A possible configuration of such detector positioned in plane 54e is shown in FIG. 6 as detector $111c_2$. An advantage of the detector positioned in plane 54e is the possibility to reduce a diameter of the aperture 165 of aperture plate 163 as compared to the embodiment illustrated with reference to FIG. 10. Reducing the diameter of aperture 165e may have an advantage that a selectivity of the particle detection downstream of this aperture will be improved. Further, a detector having a central circular detection surface can be positioned in plane 173 wherein the outer peripheral edge of such detection surface provides the radial inner edge of the aperture 177 of the aperture plate 175. This detector will then detect the particles of the first sub-group of the second group which includes those particles which are scattered in the sample 11e towards the optical axis 19e by a substantial amount greater than the scattering limit angle.

The particles having traversed the ring shaped aperture 177 in plane 173 of the particle beam microscope 1e shown in FIG. 10 traverse the energy loss spectrometer 179 positioned downstream of the plane 173 and will be incident on the detector 53e positioned in an output plane 183 of the energy loss spectrometer 179. A line focus is formed in the plane 183 due to the dispersion of the energy loss spectrometer 179. In other words, particles having different kinetic energies will be incident at different locations within the line focus on the detector 53e. The detector 53e is a position sensitive detector such that the energy loss spectrum of the particles having traversed the sample 11e can be detected. Herein, it is possible to use a further imaging system to image the plane 183 in which the line focus is formed into a subsequent plane where the detector 53e is then positioned. Such imaging can be a magnifying imaging to improve the energy resolution of the detection.

According to a variation of the particle beam microscope 1e shown in FIG. 10 it is possible to position an aperture plate having a slit-shaped aperture in plane 183 such that particles having experienced an inelastic scattering process in the sample 11e get absorbed by the plate while particles having experienced an elastic scattering process in the sample may traverse the aperture for detection by a subsequent detector. Such detector will generate a detection signal which can be referred to as an elastic bright-field signal.

Figure 11:
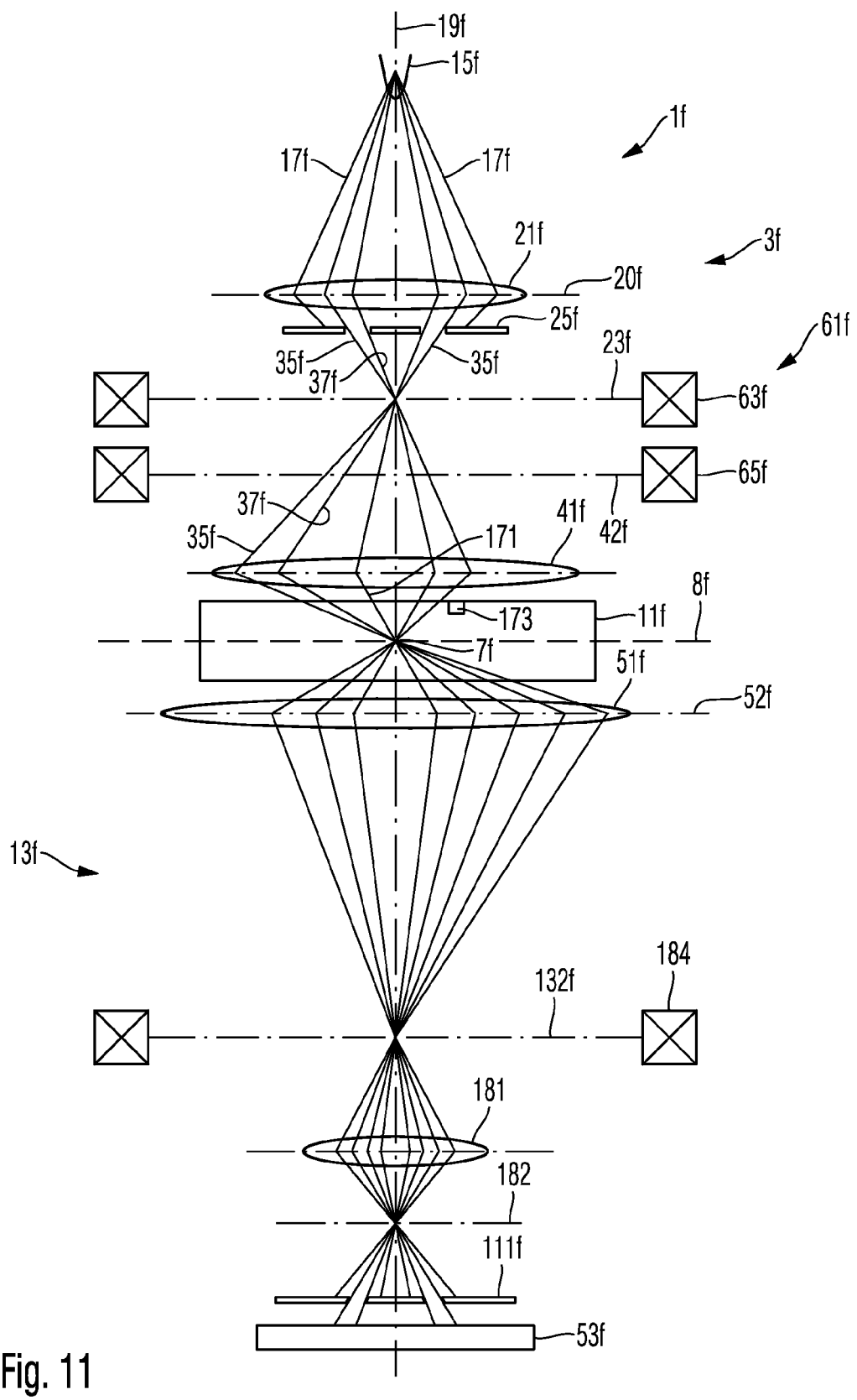
FIG. 11 is a schematic illustration of a particle beam microscope according to a seventh embodiment.

FIG. 11 is a schematic illustration of a particle beam microscope 1f having a similar configuration and similar functions as the particle beam microscopes illustrated above with reference to FIGS. 1 to 10. Also the particle beam microscope 1f has an illumination system 3f configured to focus a particle beam having a ring shaped cross section at a location 7f of a sample 11f. However, the particle beam microscope 1f is configured to tilt a main beam direction 171 of the beam focused at location 7f relative to an optical axis 19f of the particle beam microscope 1f. For this purpose, the illumination system 3f includes a particle source 15f, a condenser lens 21f and an aperture plate 25f having a ring shaped aperture 27f positioned downstream of the condenser lens 21f, wherein the aperture plate 25f can be traversed only by a beam having a ring shaped cross section and focused into a plane 23f.

A particle optical lens 41f images the plane 23f into an object plane 8f in which the location 7f is positioned within the sample 11f. Two deflectors 63f and 65f are arranged along a beam path between the aperture plate 25f and the lens 41f. The deflectors 63f and 65f are configured and can be energized by a controller such that the location 7f at which the beam is focused can be displaced in plane 8f and such that the main beam direction 171 can be tilted relative to the optical axis 19f of the electron beam microscope 1f. It is thus possible to obtain particle microscopic images of the sample 11f at different tilt angles of the main beam direction 171. The following advantage can be achieved by such tilting of the main beam direction:

FIG. 11 shows an exemplary structure which is positioned outside of the object plane 8f and which is assumed to have a high absorption for the particles of the particle beams at 173. It is apparent that the structure 173 embedded in the sample 11f is located within the ring conical particle beam having its main beam direction 171 oriented parallel to the optical axis 19f. However, in the situation shown in FIG. 11 where the main beam direction 171 is tilted relative to the optical axis 19f, the absorbing structure 173 is located outside of the ring shaped particle beam and will not disturb the detection signal corresponding to the location 7f at which the beam is focused. It is thus possible to detect differences between detected particle intensities which are associated with same locations 7f within the sample 11f but with differ with respect to tilt of the main beam direction 171. Based on such differences it is possible to eliminate disturbances of the detection signals caused by particles 173 located within the sample 11f but outside of the object plane 8f.

A detection system 13f of the particle beam microscope 1f includes an objective lens 51f which images the object plane 8f into an image plane 132f which is further imaged by a particle optical lens 181 into an image plane 182, wherein a detector 53f for detection of the particles of the first group and a detector 111f for detection of the particles of the second group are positioned in the beam path downstream of the lens 181. A deflector 184 is positioned in the image plane 132f to deflect the beam tilted relative to the optical axis 19f such that the main beam direction is again parallel to the optical axis 19f of the particle beam microscope 1f downstream of the deflector 184f. A controller is configured to energize the deflector 184 in synchronism with the deflectors 63f and 65f of the deflection system 61f of the illumination system 3f such that a tilt of the main beam direction of the beam incident onto the sample 11f generated by the deflection system 61f is compensated by the deflector 184 positioned downstream of the sample 11f and upstream of the detectors 53f and 111f or any other detectors which might be used for detection of particles having traversed the sample 11f.

Figure 12:
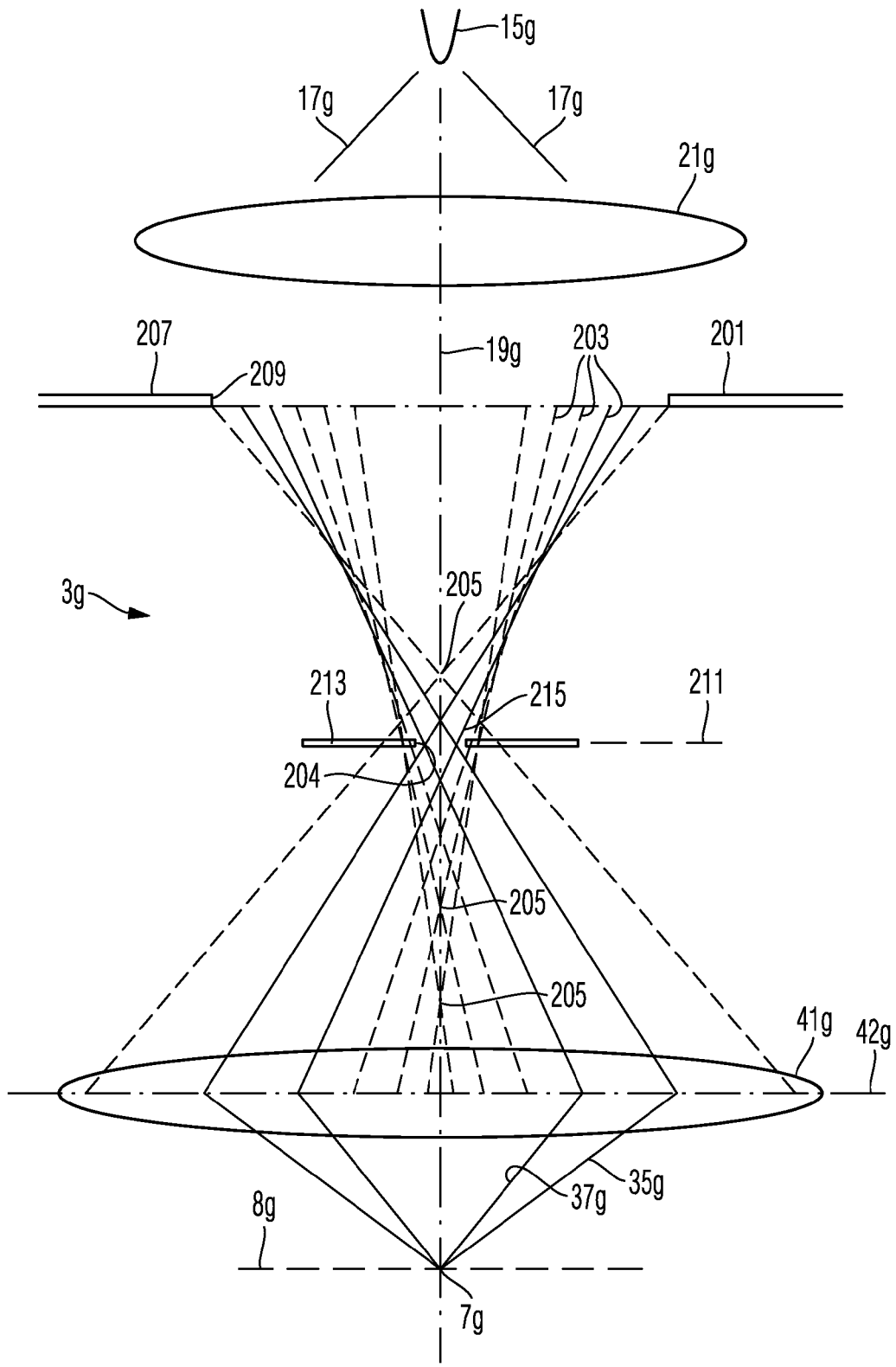
FIG. 12 is a schematic illustration of a beam path in a portion of an illumination system which can be used in a particle beam microscope.

FIGS. 1 to 11 show examples of particle beam microscopes in which an illumination beam directed onto a sample has a ring shaped cross section wherein such illumination beam is produced using an aperture plate having a ring shaped aperture. A further option of producing a beam having a ring shaped cross section will be illustrated with reference to FIG. 12 below, wherein this option can be used in all examples of electron beam microscopes disclosed in this application. An illumination system 3g shown in FIG. 12 includes a particle source 15g emitting a particle beam 17g which is focused by a lens 21g. The lens 21g has a relatively high opening error which is apparent from FIG. 12 in that exemplary trajectories 203 of particles traversing a plane 201 at different distances from an optical axis 19g intersect the optical axis at different positions 205 along the optical axis 19g. An aperture plate 207 having a circular aperture 209 is positioned in plane 201, and a further aperture plate 213 having an aperture 204 is positioned in a plane 211 downstream of plane 201. The aperture 204 of aperture plate 213 can be traversed only by a portion of the trajectories 203. Those trajectories which can traverse the aperture 204 form a ring shaped beam downstream of the aperture plate 213, wherein this ring shaped beam can be focused onto a location 7g within a sample by a focusing lens 41g. The aperture 204 of aperture plate 213 may have a small diameter, such as a diameter of 10 µm, for example, and should be precisely adjusted relative to the optical axis 19g.

Figure 13:
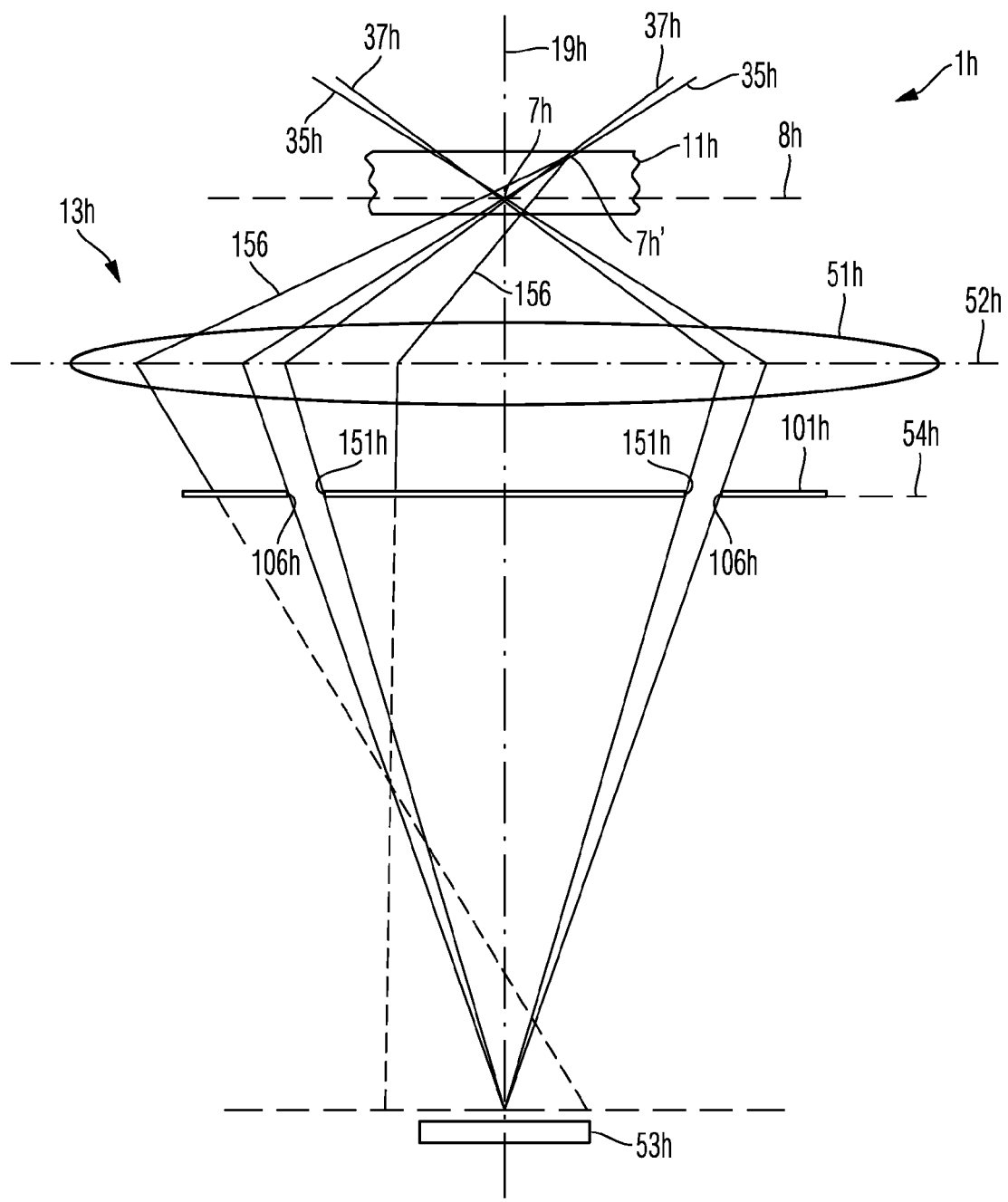
FIG. 13 is a schematic illustration of a particle beam microscope according to an eighth embodiment.

FIG. 13 is a schematic illustration of a detail of a particle beam microscope 1h having an illumination system configured to focus a particle beam having a ring shaped cross section at a location 7h within a sample 11h. The beam focused at location 7h has inner an envelope 37h of a conical shape and an outer envelope 35h of a conical shape. A particle optical lens 51h is positioned in the beam path downstream of the sample 11h and has a back focal plane 54h in which an aperture plate 101 having a ring shaped aperture is positioned. The ring shaped aperture is defined by a radial inner edge 151h and a radial outer edge 106h. The aperture plate 101h allows particles to traverse via the ring shaped aperture which have not been scattered at focus location 7h or which have been scattered at focus location 7h by a scattering angle smaller than a scattering limit angle. These particles can be detected by a detector 53h positioned in the beam path downstream of the aperture plate 101h.

FIG. 13 shows two exemplary trajectories 156 of particles which are scattered in the sample 11h at a location 7h' which is located at a distance from the focus location 7h. However, location 7h' is located within the ring shaped focused incident beam, i.e. location 7h' is located between the envelopes 37h and 35h. Therefore, incident particles can be scattered at location 7h' and propagate along exemplary trajectories 156. These particles will be incident on the aperture plate 101h and will be absorbed by the aperture plate 101h while they are typically not able to traverse the aperture plate 101h via its ring shaped aperture. The majority of the incident particles which are scattered at a distance from the focused location 7h will not be able to reach the detector 53h, and they will not contribute to detection signals recorded by the detector 53h. The ring shaped aperture located in the back focal plane 54h of lens 51h is suitable to reduce disturbance signals which could result from particles scattered at a distance from the focus location 7h, accordingly.

From FIG. 13 it is further evident that a scattering structure at a location 7h' which is located on the right side of the focus location 7h will scatter particles of the beam such that they will be incident on the aperture plate 101h on a left side of the optical axis 19h. Particles of the beam which are scattered at the scattering structure located at a distance from the optical axis 19 will be incident onto the aperture plate 101h with an intensity distribution about the optical axis 19h which is not uniform. According to a variation of the example shown in FIG. 7, a detector, such as the detector $111c_2$ shown in FIG. 7, includes a plurality of detection elements distributed about the optical axis 19h. Such detector can be positioned in the back focal plane 54h to detect such non-uniform intensity distribution. Such detector can be used to detect particles of the beam which are scattered at locations spaced apart from the focused location 7h. On the other hand, particles which are scattered at the focus location 7h will be also incident on the detector. These particles, however, will generate an intensity distribution about the optical axis 19h which is uniform. By using a segmented detector as illustrated above and which has a plurality of detection segments distributed about the optical axis 19h and positioned in the back focal plane 54h, it is possible to distinguish scattering events caused by scattering structures located at a distance from the focus location 7h from scattering events caused by structure located at the focus location 7h.

Figure 14:
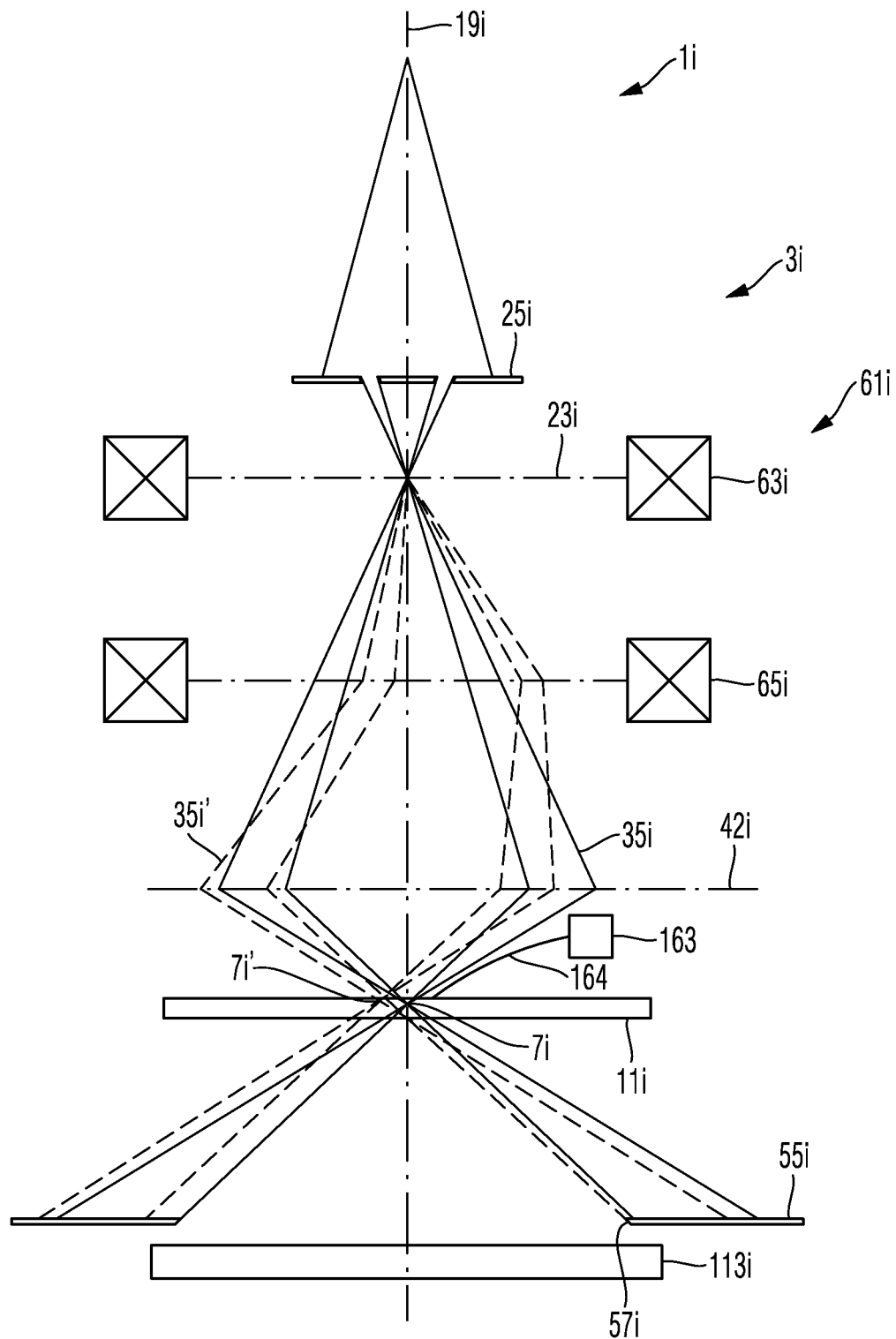
FIG. 14 is a schematic illustration of a particle beam microscope according to a ninth embodiment.

FIG. 14 is a schematic illustration of a further example of a particle beam microscope 1i. Again, the microscope includes an illumination system 3i producing a particle beam having a ring shaped cross section and focused at a location 7i within a sample 11i. The particle beam microscope 1i differs from the particle beam microscopes illustrated with reference to FIGS. 1 to 13 above in that a detection system 13i includes at least one detector which is positioned downstream of the sample and wherein no particle optical lens is positioned between the sample 11i and that at least one detector. The illumination system 3i includes a deflection system 61f which may have one deflector or two deflectors 63i, 65i, or even more deflectors, configured to displace the location 7i at which the beam is focused within the sample 11i in a direction transverse to an optical axis 19i of the microscope 1i. Broken lines in FIG. 14 show a beam path occurring in an exemplary situation where the beam is focused at a location 7i' which is spaced apart from the optical axis 19i. An aperture plate 55i having a circular aperture defined by an inner peripheral edge 57i of the aperture plate is located in the beam path downstream of the sample 11i. A diameter of the circular aperture is selected such that particles which have traversed the sample 11i substantially un-scattered will be incident on the aperture plate 55i. These particles will not be able to traverse the aperture 55i. Similarly, particles which are scattered within the sample away from the optical axis 19i will not be able to traverse the aperture plate 55i. However, particles which are scattered in the sample 11i by a substantial scattering angle towards the optical axis 19*i* will be able to traverse the aperture plate 55*i* through its circular aperture to be incident on a detector 113*i*. It is thus possible to detect a dark fields signal with the detector 113*i*.

The options for generating a focused particle beam having a ring shaped cross section illustrated above involve the generation of the beam such that, at any given time, particles can be found within the whole ring shaped cross section of the beam. It is, however, also possible to achieve an effect of a beam having a ring shaped cross section by sequentially deflecting a beam having a small full cross section such that it is sequentially scanned, by using deflectors, to all those directions which correspond to the beam having the ring shaped cross section. The beam having the small cross section will then be incident at the focus location from different directions at different times. A detection signal detected from particles of such scanned beam can be averaged over a duration for performing the angular scan such that the averaged detection signals will correspond to the detection signal produced by detectors of the examples illustrated above in which the incident beam has the full ring shaped cross section. Such generation of the beam having the ring shaped cross section may have an advantage over the examples illustrated above in that ring shaped apertures absorbing a large portion of the incident beam are not necessary, such that a greater portion of the particles generated by the particle beam source can be used for being incident on the sample.

In the examples illustrated above, it is further possible to vary the apex angle of the conical focused beam and to record measurements at different apex angels of the beam. Each of such measurements will include signal components resulting from incident particles which are scattered within the sample at locations spaced apart from the location at which the beam is focused. The signal components will vary in dependence of the apex angle, accordingly. On the other hand, signal components originating from incident particles scattered at the focus location will be present in all measurements with a same intensity. Therefore, varying of the apex angle can be used to eliminate disturbing signals caused by scattering events at locations spaced apart from the focus location.

Similarly, it is possible to vary the main beam direction of the incident beam for the same purpose as it is illustrated with reference to FIG. 11 above. Again, plural measurements can be performed at different settings of the main beam direction, and a comparison of such measurements can be used to eliminate disturbing signals caused by scattering events at locations spaced apart from the focus location. Particle microscopic images obtained by such variation of the main beam direction or of the apex angle will have a high image contrast, accordingly.

In the examples illustrated above, an object region is illuminated with a particle beam having a ring shaped cross section. Exemplary values of an apex angle of a conical inner envelope of such beam are 30 mrad, 60 mrad and 90 mrad.

A ratio of the outer apex angle and the inner apex angle can be smaller or equal to at least on of 1.1, 1.02 and 1.005

A difference between the outer apex angle and inner apex angle can be less than or equal to at least one of 20 mrad, 10 mrad and 5 mrad.

An angular difference between the apex angle of the conical inner envelope and an apex angle of the conical outer envelope of the beam can be, for example 0.1 mrad, 0.5 mrad or some mrads. Using such particle beam having a ring-shaped cross section it is possible to achieve a focus region of a relatively small extension.

The embodiments illustrated above use particle optical lenses for focusing the particle beam in an object region, for directing particles emanating from the object region towards a detector and for providing image planes and focal planes, in which detectors and/or aperture plates having apertures can be located. The particle optical lenses may provide electrostatic fields, magnetic fields and combinations of electrostatic and magnetic fields to provide a focusing lens power to the particles traversing the lenses. Herein, all the individual lenses shown in the examples illustrated above as single lenses and represented in the Figures often as an ellipse can be provided by a plurality of individual lenses in practice. Thus, individual lenses shown in the examples above can be replaced by plural lenses in a practical embodiment. Similarly, two adjacent individual lenses of the examples illustrated above can be provided by one single lens in practice. For example, it is quite common that the function of the two lenses 41 and 51 of FIG. 1 is provided by one single lens arrangement of a suitable configuration.

Still further, it is possible to use corrected lens systems to reduce opening errors and chromatic errors occurring in focusing of particle beams. Examples of such lens systems are known from WO 02/067286 A2, EP 0 530 640 A1 and EP 0 451 370 A1, the entire contents of each of which are hereby incorporated by reference.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A particle beam microscope having a beam path that traverses an object region, the particle beam microscope comprising:
   an illumination system located in the beam path upstream of the object region, the illumination system comprising a first particle optical lens, and the illumination system being configured to direct particles to the object region such that the particles are incident at the object region only from directions oriented under an angle, relative to a main axis of the beam path, which is greater than an inner apex angle; and
   a detection system located in the beam path downstream of the object region and configured to detect only one group of particles among first and second groups of particles that traversed the object region, the first group of particles comprising only particles that traversed the object region along a straight line and particles scattered at the object region by an angle smaller than a scattering limit angle, and the second group of particles comprising only particles scattered at the object region by a scattering angle greater than the scattering limit angle,
   wherein the detection system comprises an aperture plate having an aperture with a radial inner edge located a distance from an optical axis of the particle beam microscope.

2. The particle beam microscope according to claim 1, wherein the illumination system is configured to direct particles to the object region such that the particles are incident at the object region only from directions oriented under an angle, relative the main axis of the beam path, which is smaller than an outer apex angle.

3. The particle beam microscope according to claim 1, wherein the inner apex angle is greater than 30 mrad.

4. The particle beam microscope according to claim 2, wherein a ratio of the outer apex angle and the inner apex angle is less than or equal to 1.1.

5. The particle beam microscope according to claim 2, wherein a difference between the outer apex angle and inner apex angle is greater than 0.1 mrad.

6. The particle beam microscope according to claim 1, wherein a difference between the outer apex angle and inner apex angle is less than or equal to 20 mrad.

7. The particle beam microscope according to claim 1, wherein the illumination system is configured to direct the particles onto an extended region within an object plane located in the object region.

8. The particle beam microscope according to claim 1, wherein the illumination system is configured to focus the particles at a focus location within the object region.

9. The particle beam microscope according to claim 8, wherein the illumination system comprises a deflector configured to displace the focus location in a direction transverse to the main axis of the beam path.

10. The particle beam microscope according to claim 1, wherein the illumination system comprises a deflector configured to change a direction of the main axis of the beam path relative to an optical axis of a focusing lens of the illumination system.

11. The particle beam microscope according to claim 2, wherein the illumination system is configured to change an angle by more than 0.1 mrad, the angle being selected from the group consisting of the inner apex angle and the outer apex angle.

12. The particle beam microscope according to claim 1, wherein the illumination system comprises an aperture plate having an aperture with a radial inner edge located at a distance from the optical axis of the particle beam microscope.

13. The particle beam microscope according to claim 12, wherein the illumination system comprises a focusing lens, and the aperture plate of the illumination system is positioned in a plane selected from the group consisting of a front focal plane of the particle optical lens and a plane conjugate to the front focal plane of the particle optical lens.

14. The particle beam microscope according to claim 1, wherein the aperture of the aperture plate has a radial outer edge.

15. The particle beam microscope according to claim 1, wherein the detection system comprises a first detector located downstream of the aperture plate.

16. The particle beam microscope according to claim 1, wherein the aperture plate includes a second detector.

17. The particle beam microscope according to claim 1, wherein the aperture of the aperture plate is dimensioned such that it can be traversed only by particles of the first group.

18. The particle beam microscope according to claim 1, wherein:
the aperture of the aperture plate is dimensioned such that at least one of first and second sub-groups of particles is incident on the aperture plate;
at least one of the first group of particles and only one of the first and second sub-groups of particles traverse the aperture of the aperture plate;
the first sub-group of particles comprises only particles scattered at the object region towards an optical axis of the particle beam microscope; and
the second sub-group of particles comprises only particles scattered at the object region away from the optical axis of the particle beam microscope.

19. The particle beam microscope according to claim 1, wherein the aperture plate has first and second aperture portions, and a radial inner edge of the second aperture portion is located a greater distance from the optical axis than is a radial outer edge of the first aperture portion.

20. The particle beam microscope according to claim 1, wherein the detection system comprises a particle optical lens configured to image an object plane located within the object region into an image plane.

21. The particle beam microscope according to claim 20, wherein the aperture plate is positioned in a plane selected from the group consisting of a back focal plane of the particle optical lens of the detection system and a plane conjugate to the back focal plane of the particle optical lens of the detection system.

22. The particle beam microscope according to claim 20, wherein the detection system comprises a second deflector positioned in one of the image plane and a plane conjugate to the image plane.

23. A particle beam microscope having a beam path that traverses an object region, the particle beam microscope comprising:
an illumination system located in the beam path upstream of the object region, the illumination system comprising a first particle optical lens, and the illumination system being configured to direct particles to the object region such that the particles are incident at the object region only from directions oriented under an angle, relative to a main axis of the beam path, which is greater than an inner apex angle; and
a detection system located in the beam path downstream of the object region and configured to detect only one group of particles among first and second groups of particles that traversed the object region, the first group of particles comprising only particles that traversed the object region along a straight line and particles scattered at the object region by an angle smaller than a scattering limit angle, and the second group of particles comprising only particles scattered at the object region by a scattering angle greater than the scattering limit angle;
wherein:
the detection system comprises a first aperture plate having an aperture with a radial outer edge located at a distance from an optical axis of the particle beam microscope;
the detection system comprises a second aperture plate having an aperture with a radial outer edge located at a distance from an optical axis of the particle beam microscope;
wherein the first aperture plate is positioned upstream of the second aperture plate in the beam path; and
the first and second aperture plates are positioned such and the apertures of the first and second aperture plates are dimensioned such and particles having traversed the aperture of the first aperture plate are incident on the second aperture plate.

24. The particle beam microscope according to claim 23, wherein the detection system comprises a particle optical lens configured to image an object plane located within the object region into an image plane.

25. The particle beam microscope according to claim 24, wherein the at least one of the first and second aperture plates is positioned in a plane selected from the group consisting of a back focal plane of the particle optical lens of the detection system and a plane conjugate to the back focal plane of the particle optical lens of the detection system.

26. The particle beam microscope according to claim 24, wherein the first aperture plate is positioned upstream of the image plane, and the second aperture plate is positioned downstream of the image plane.

27. The particle beam microscope according to claim 23, wherein the illumination system is configured to direct particles to the object region such that the particles are incident at the object region only from directions oriented under an angle, relative the main axis of the beam path, which is smaller than an outer apex angle.

28. The particle beam microscope according to claim 23, wherein the inner apex angle is greater than 30 mrad.

29. The particle beam microscope according to claim 23, wherein the illumination system is configured to direct the particles onto an extended region within an object plane located in the object region.

30. The particle beam microscope according to claim 23, wherein the illumination system is configured to focus the particles at a focus location within the object region.

31. The particle beam microscope according to claim 30, wherein the illumination system comprises a deflector configured to displace the focus location in a direction transverse to the main axis of the beam path.

32. The particle beam microscope according to claim 23, wherein the illumination system comprises an aperture plate and a focusing lens, the aperture plate of the illumination system has an aperture with a radial inner edge located at a distance from the optical axis of the particle beam microscope, and the aperture plate of the illumination system is positioned in a plane selected from the group consisting of a front focal plane of the particle optical lens of the illumination system and a plane conjugate to the front focal plane of the particle optical lens of the illumination system.

33. The particle beam microscope according to claim 23, wherein the detection system comprises a first detector located downstream of the second aperture plate.

34. The particle beam microscope according to claim 23, wherein at least one of the first aperture plate and the second aperture plate includes a second detector.

35. The particle beam microscope according to claim 23, wherein the aperture of the first aperture plate is dimensioned such that it can be traversed by particles of the first group.

* * * * *

UNITED STATES PATENT AND TRADEMARK OFFICE
CERTIFICATE OF CORRECTION

PATENT NO. : 8,471,203 B2 Page 1 of 1
APPLICATION NO. : 12/756455
DATED : June 25, 2013
INVENTOR(S) : Gerd Benner It is certified that error appears in the above-identified patent and that said Letters Patent is hereby corrected as shown below:

In the Specification:

Column 7, Line 12, delete "of the of the" insert --of the--;

Column 7, Line 21, delete "a" insert --α--;

Column 17, Line 56, delete "on" insert --one--;

Column 17, Line 56, delete "1.005" insert --1.005.--.

Signed and Sealed this
Eighth Day of October, 2013

Teresa Stanek Rea
*Deputy Director of the United States Patent and Trademark Office*